United States Patent [19]
Crick

[11] Patent Number: 5,995,588
[45] Date of Patent: Nov. 30, 1999

[54] TONE LOCATION DEVICE FOR LOCATING FAULTS IN A PAIRED LINE

[76] Inventor: Robert G. Crick, P.O. Box 8009, Rancho Santa Fe, Calif. 92067

[21] Appl. No.: 08/867,310

[22] Filed: Jun. 2, 1997

Related U.S. Application Data

[63] Continuation-in-part of application No. 08/523,071, Sep. 1, 1995, abandoned.

[51] Int. Cl.[6] .................................................. H04M 1/24
[52] U.S. Cl. ................................. 379/22; 379/6; 379/26; 379/27; 324/527; 324/528; 324/530
[58] Field of Search .............................. 379/1, 6, 21, 22, 379/25, 26, 27, 29–30, 32; 324/500, 512, 527–528, 529–530, 67, 541–542, 539–544; 455/41, 67.4

[56] References Cited

U.S. PATENT DOCUMENTS

| | | | |
|---|---|---|---|
| 2,651,021 | 9/1953 | Hays, Jr. ...................................... | 324/52 |
| 2,717,992 | 9/1955 | Weintraub .................................. | 340/253 |
| 2,769,868 | 11/1956 | Brownlow ................................. | 179/171 |
| 3,155,897 | 11/1964 | Rice ............................................ | 324/52 |
| 3,597,680 | 8/1971 | Haddon ..................................... | 324/67 |
| 3,617,865 | 11/1971 | Hakata . | |
| 3,711,767 | 1/1973 | Campbell et al. ........................ | 324/530 |
| 3,792,350 | 2/1974 | Bossler et al. .............................. | 324/52 |
| 3,831,086 | 8/1974 | Pesto .......................................... | 324/67 |
| 3,882,287 | 5/1975 | Simmonds ........................ | 179/175.3 A |
| 3,891,811 | 6/1975 | Miller .................................... | 179/175.3 |
| 3,991,363 | 11/1976 | Lathrop ..................................... | 324/52 |
| 4,001,559 | 1/1977 | Osborne et al. ..................... | 235/151.31 |
| 4,142,143 | 2/1979 | Daniel ..................................... | 324/529 |
| 4,291,204 | 9/1981 | Crick ................................. | 179/175.3 F |
| 4,322,677 | 3/1982 | Wright ...................................... | 324/52 |
| 4,370,610 | 1/1983 | Allen et al. ............................... | 324/52 |
| 4,518,911 | 5/1985 | Cass ........................................ | 324/521 |
| 4,663,775 | 5/1987 | Olek ........................................... | 379/24 |
| 4,818,944 | 4/1989 | Rippingale ............................... | 324/326 |
| 4,835,478 | 5/1989 | Haddon et al. .......................... | 324/536 |
| 4,918,623 | 4/1990 | Lockitt et al. ........................... | 709/224 |
| 5,157,336 | 10/1992 | Crick ...................................... | 324/613 |
| 5,157,708 | 10/1992 | Garthwaite et al. ...................... | 379/21 |
| 5,189,375 | 2/1993 | Tuttle ...................................... | 324/537 |
| 5,210,498 | 5/1993 | Paananen ................................. | 324/529 |
| 5,302,905 | 4/1994 | Crick ...................................... | 324/613 |
| 5,347,225 | 9/1994 | Graham ................................... | 324/523 |
| 5,391,991 | 2/1995 | Tuttle ................................... | 324/529 |
| 5,570,028 | 10/1996 | Sperlazzo et al. ...................... | 324/528 |

FOREIGN PATENT DOCUMENTS

| | | | |
|---|---|---|---|
| 0 010 841 | 5/1980 | European Pat. Off. ........ | G01R 31/08 |
| 2 451 587 | 10/1980 | France ............................. | G01R 31/08 |
| 1 052 559 | 3/1959 | Germany . | |
| 2 045 955 B | 11/1980 | United Kingdom ........... | G01R 31/02 |

*Primary Examiner*—Curtis A. Kuntz
*Assistant Examiner*—Duc Nguyen
*Attorney, Agent, or Firm*—Rodney F. Brown

[57] ABSTRACT

A device and method are provided for locating faults in a paired line. The fault locating device has a transmitting unit connectable to the conductors of a paired line containing the fault. The device also has a portable receiving unit to track the path of the paired line. The transmitting unit contains circuits for creating and transmitting a locator signal and a carrier signal including synchronization through the conductors toward the receiving unit. The receiving unit contains a pickup coil positioned proximal to the paired line, inducing induced locator and carrier signals in the pickup coil. The receiving unit also contains circuits for processing the induced locator and carrier signals and for producing a synchronization signal used to detect and segregate a component of the induced locator signal which is indicative of a fault. The presence or absence of the indicative component is communicated to an operator by means of an audible or visual fault indicator.

26 Claims, 4 Drawing Sheets

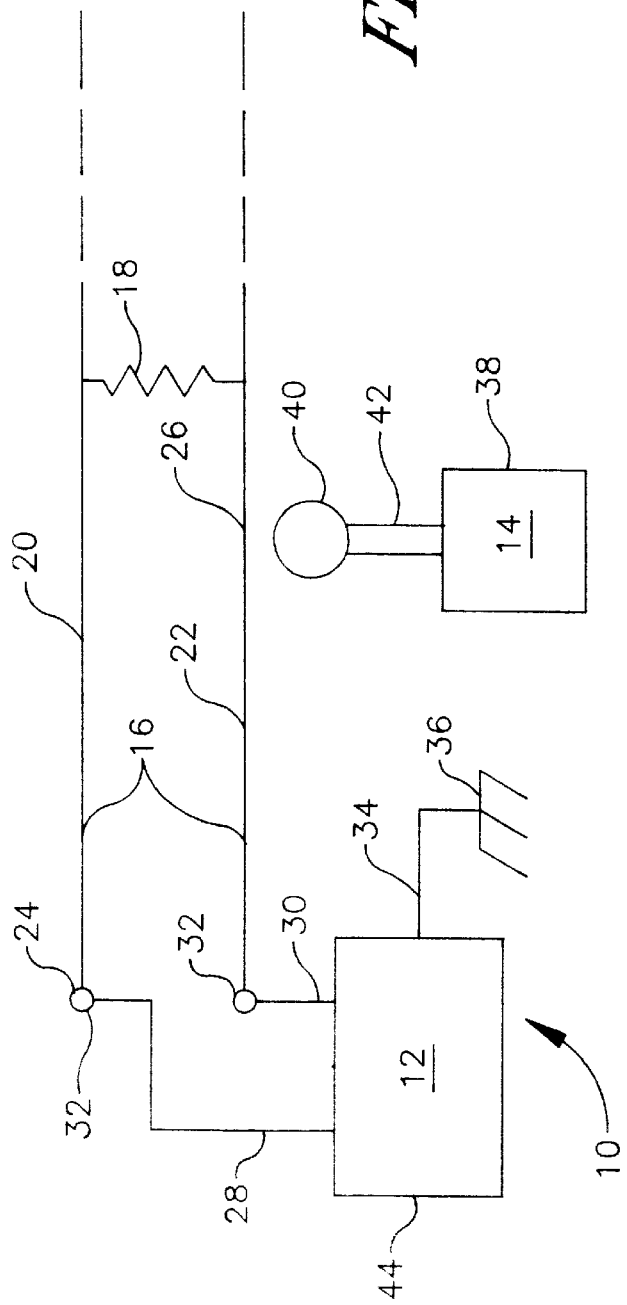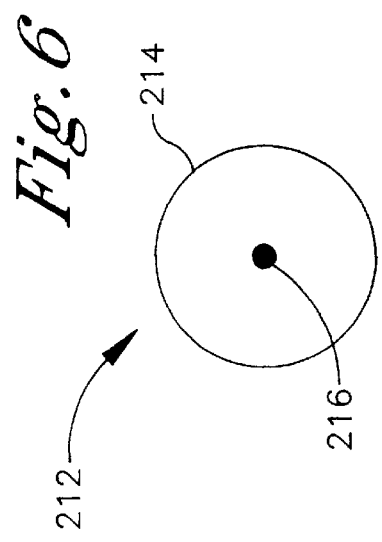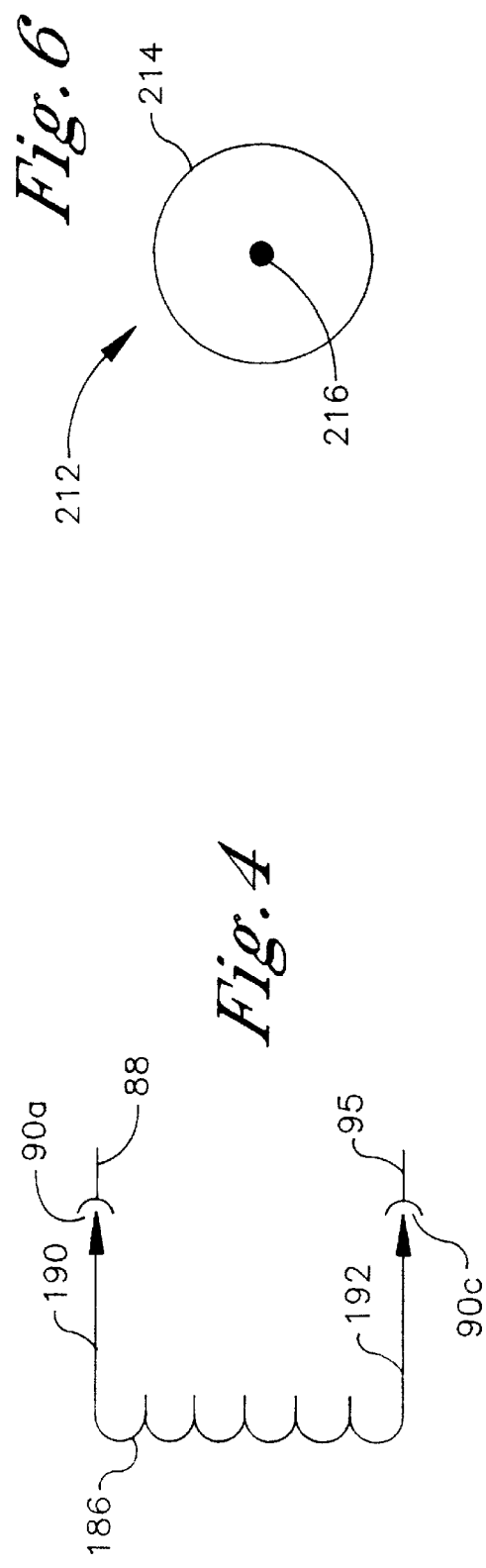

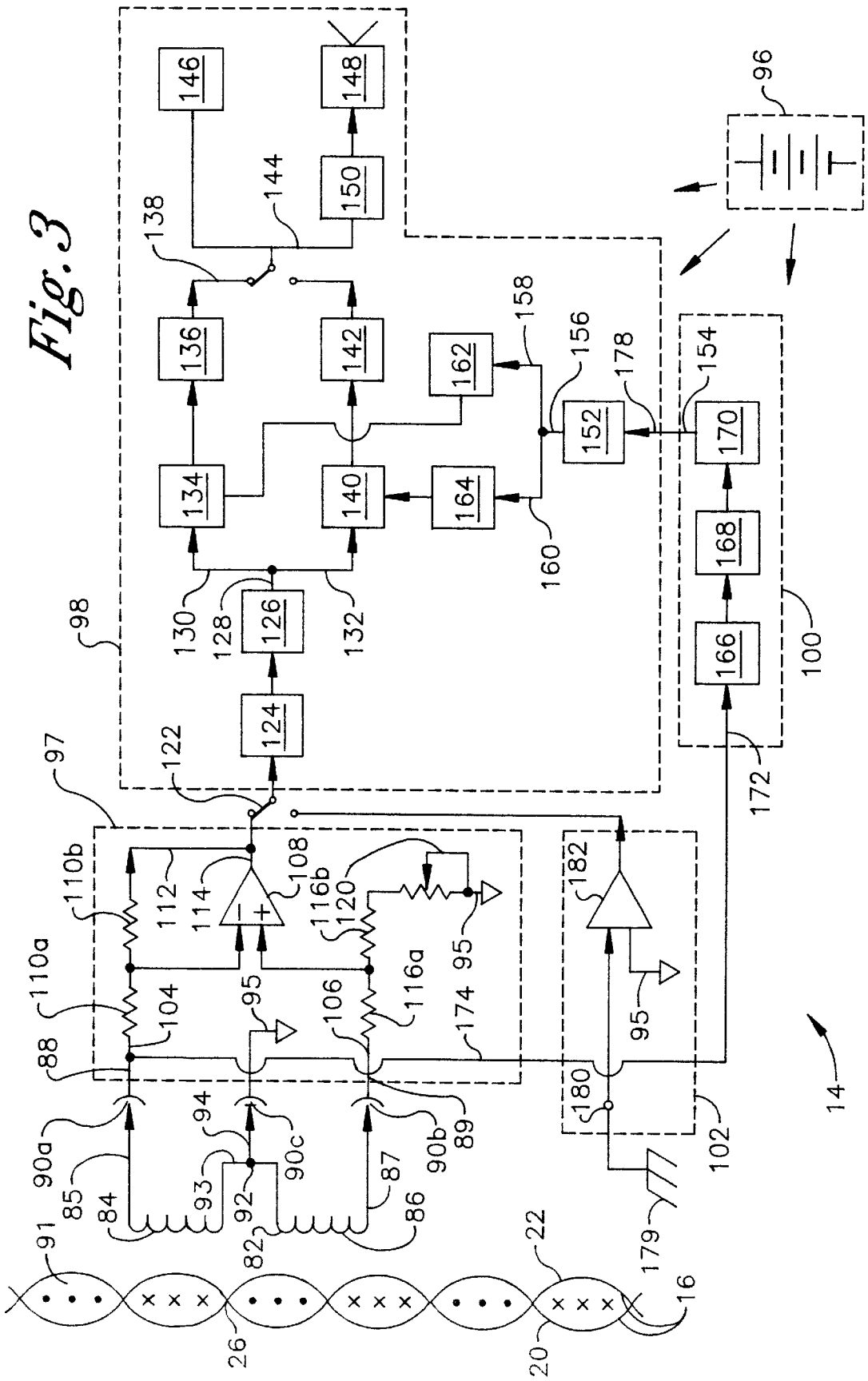

TONE LOCATION DEVICE FOR LOCATING FAULTS IN A PAIRED LINE

The present application is a continuation-in-part of application Ser. No. 08/523,071 filed on Sep. 1, 1995 now abandoned.

TECHNICAL FIELD

The present invention relates generally to fault location in a paired line, and more particularly, to a device and method for locating faults in a paired line by monitoring a locator signal introduced into the paired line.

BACKGROUND OF THE INVENTION

A paired line is a conventional means of carrying telecommunications transmissions. A paired line is typically two balanced conductors individually insulated and twisted together along their length. A plurality of paired lines are usually bundled together to form a paired cable containing up to one hundred or more paired lines surrounded by a shield, wherein each paired line of the paired cable is capable of independently carrying a signal. The paired lines of a telecommunications cable are typically spiraled together in groups, having a characteristic spiral pattern termed the lay. A paired line is generally an effective telecommunications carrier, however, a fault can occasionally occur in a paired line limiting the effectiveness thereof. For example, a resistance fault can occur in a paired line when water invades the outer protective covering of a paired cable. The resulting resistance fault is a resistive contact between the two conductors of a paired line within the paired cable. The resistance fault is also often accompanied by a resistance from one of the two conductors of the paired line to ground or to another conductor of the paired cable. Another type of fault can occur when there is a discontinuity or break in the shield of the paired cable. The fault allows an increased coupling of extraneous voltages into one or more enclosed paired lines of the paired cable from nearby sources, such as power transmission cables. An open conductor fault or an underdesired bridged tap is a fault which interrupts current flow through a paired line or unbalances the paired line, diminishing the effectiveness of the paired line for telecommunications applications.

Such faults typically cause noise in the affected paired line that is extremely disruptive to the clarity of the telecommunications signal sent over the paired line. A disruptive to the clarity of the telecommunications signal sent over the paired line. A fault in a paired line can also cause other problems such as circuit failure, arc-over and corrosion. Therefore, it is desirable to locate and repair faults in a paired line, particularly a paired line in a telecommunications cable Since telecommunications cables are not always readily accessible, often being buried below ground, noninvasive methods are preferred for locating faults in a paired line of a telecommunications cable. Tone location methods are conventional noninvasive means for locating a short fault in a paired line of a telecommunications cable using an audible tone as a locator signal. However, tone location methods are often ineffective for locating most resistance faults in a paired line. One reason for such ineffectiveness is a phenomenon termed carry-by. Carry-by occurs at faults that exceed a threshold resistance typically above about 2000 ohms. Most resistance faults have a resistance in a range between about 5000 to about 50,000 ohms. When a resistance exceeding the threshold resistance for carry-by is encountered at the resistance fault in a paired line, the current of the audible tone produces a voltage across the conductors of the paired line past the fault. This voltage causes a corresponding tone current to flow into pair capacitance beyond the fault. Thus, a tone will be audible beyond the resistance fault defeating the tone location method. The problem of carry-by is particularly acute when a high-frequency tone is present in the paired line because the magnitude of tone current flow past the fault is directly related to the frequency of the tone.

It is further noted that less tone current is typically driven through the paired line as the level of fault resistance increases. At relatively high levels of resistance, such as encountered in resistance faults, the level of tone current available for detection can drop below the background noise level present on a paired cable. Consequently, the background noise masks the location of the fault.

Alternate tone location methods have been developed in the telephone industry for detecting resistance faults, which overcome the above-described limitations caused by carry-by. For example, one alternate tone location method uses a 600-volt, breakdown test set to weld the conductors of the paired line together at the fault, which reduces fault resistance to zero in the paired line, thereby allowing effective tone location of the resistance fault. This tone location method, however, can cause extensive cable and equipment damage, particularly to plastic insulated cable and electronic central offices due to the high breakdown voltages used. Accordingly, this tone location method for overcoming fault resistance is disfavored.

Another alternate tone location method for locating resistance faults is disclosed in U.S. Pat. No. 4,291,204, wherein a tone locating device temporarily reduces the fault resistance to a low value by establishing a transient arc at the fault. Passing the fault locating tone through the low-resistance arc at the fault reduces tone carry-by, but does not entirely eliminate it. In addition, the conductors and equipment are susceptible to damage caused by formation of the transient arc, albeit to a lesser degree than the damage potential of the previously described tone location method.

Accordingly, it is an object of the present invention to provide a device and method for effectively locating faults in a paired line using a locator signal. In particular, it is an object of the present invention to provide a device and method for effectively locating resistance faults in a paired line using a locator signal. It is another object of the present invention to provide a device for effectively locating open faults or bridged taps in a paired line using a locator signal. It is yet another object of the present invention to provide a device and method for effectively locating shield break faults in a paired cable. It is another object of the present invention to provide a device and method for effectively locating faults in a paired line using a locator signal, wherein background noise is overcome. It is still another object of the present invention to provide a device and method for effectively locating faults using a locator signal, wherein the impact of carry-by is minimized. It is a further object of the present invention to provide a device and method for effectively locating faults in a paired line using a locator signal, wherein the device is fully portable in the field for expeditiously tracking relatively long lengths of the paired line. These objects and others are accomplished in accordance with the invention described hereafter.

SUMMARY OF THE INVENTION

The present invention is a device and method for locating a fault in a paired line. The device and method are particularly applicable to the location of a resistance fault in a paired line of a telecommunications cable. The fault locating device comprises a transmitting unit and a receiving unit.

The transmitting unit is electrically coupled with the two conductors of a paired line believed to contain a fault. The transmitting unit has internal circuitry, including a power source, a locator signal transmission circuit having a locator signal output, and a carrier signal transmission circuit having a carrier signal output. The locator signal transmission circuit is configured to create a locator signal, convert the locator signal to two locator signals of opposite polarity, and introduce the polar opposite locator signals into the respective conductors of the paired line. The carrier signal transmission circuit is configured to create a carrier signal, provide the carrier signal with modulated synchronization, and introduce the modulated carrier signal into the conductors of the paired line.

The receiving unit is portable, enabling an operator to track the path of the conductors with the receiving unit. The receiving unit has internal circuitry and an associated pickup coil, preferably having a balanced configuration. The pickup coil is positioned proximal to the conductors of the paired line, providing magnetic coupling with the conductors, but avoiding electrical contact with the conductors. The balanced pickup coil is configured such that two induced locator signals of opposite polarity and an induced carrier signal are simultaneously induced in the pickup coil in response to the polar opposite locator signals and carrier signal traveling through the conductors. The internal circuitry of the receiving unit includes a power source, an induced locator signal balancing/amplifying circuit, an induced locator signal processing circuit having a component detector, an induced carrier signal processing circuit having a synchronization signal output, and a capacitive signal processing circuit. The induced locator signal balancing/amplifying circuit is configured to produce a balanced induced locator signal from the two induced locator signals of opposite polarity, thereby minimizing the effect of noise in the receiving unit. The induced locator signal processing circuit is configured to detect first and second components of the balanced induced locator signal indicative of first and second types of faults, respectively, segregate the first and second indicative components from one another, and communicate the presence of either indicative component to the operator in the form signal processing circuit is configured to receive the induced carrier signal from the pickup coil and demodulate the induced carrier signal, and transmit the resulting demodulated synchronization signal to the induced locator signal processing circuit. The induced locator signal processing circuit produces first and second synchronization signals from the demodulated synchronization signal, which correspond to the first and second components of the balanced induced locator signal. The first and second synchronization signals are utilized to detect and segregate the first and second components of the balanced induced locator signal. The capacitive signal processing circuit is configured to create a differential capacitive signal from a locator signal on the cable shield and communicate a fault indicator to the operator in response to the differential capacitive signal.

Operation of the present fault locating device is performed by connecting the transmitting unit in electrical communication with both conductors of the paired line and positioning the receiving unit proximal to the paired line adjacent to the transmitting unit. The transmitting unit introduces the polar opposite locator signals and the modulated carrier signal into the conductors of the paired line. The locator and carrier signals travel along the conductors to induce the induced locator and carrier signals in the balanced pickup coil. The receiving unit processes the resulting induced locator and carrier signals to detect and segregate the components of the induced locator signal. The receiving unit continuously communicates the presence or absence of a component indicative of a fault to the operator by means of a fault indicator.

The operator incrementally repositions the receiving unit away from the transmitting unit along the path of the paired line as operation of the fault locating device proceeds. As the receiving unit approaches the fault, the intensity or frequency of the fault indicator remains substantially constant. However, when the receiving unit passes the fault so that the fault is between the receiving unit and the transmitting unit, the intensity or frequency of the fault indicator abruptly drops, thereby establishing the precise location of the fault.

In accordance with an alternate method of operation, shield break faults are located by introducing a locator signal into the paired line. A capacitive signal is created in the pickup coil in response to the locator signal in the paired line, wherein the pickup coil is a capacitive pickup functioning as a capacitor. The capacitive signal is received by the capacitive signal processing circuit, which is referenced to ground. The capacitive signal is converted to a differential capacitive signal utilizing the ground reference. The receiving unit continually communicates the value of the differential capacitive signal to the operator by means of a fault indicator.

The operator incrementally repositions the receiving unit away from the transmitting unit along the path of the paired line as operation of the fault locating device proceeds. As the receiving unit approaches the shield break fault, the intensity or frequency of the fault indicator remains substantially constant. However, when the receiving unit reaches the shield break fault, the intensity or frequency of the fault indicator abruptly increases, thereby establishing the precise location of the shield break fault.

The present invention will be further understood, both as to its structure and operation, from the accompanying drawings, taken in conjunction with the accompanying description, in which similar reference characters refer to similar parts.

BRIEF DESCRIPTION OF THE DRAWINGS

FIG. 1 is a conceptual view of a fault locating device of the present invention operably positioned in relation to a paired line.

FIG. 3 is a block diagram of the receiving unit shown in the device of FIG. 1.

FIG. 4 is a conceptual view of an alternate pickup coil configuration having utility in the fault location device of the present invention.

FIG. 6 is a conceptual cross-sectional view of a shielded cable, to which the fault location device of the present invention is applied, for detecting a shield break.

DESCRIPTION OF PREFERRED EMBODIMENTS

Figure 2:
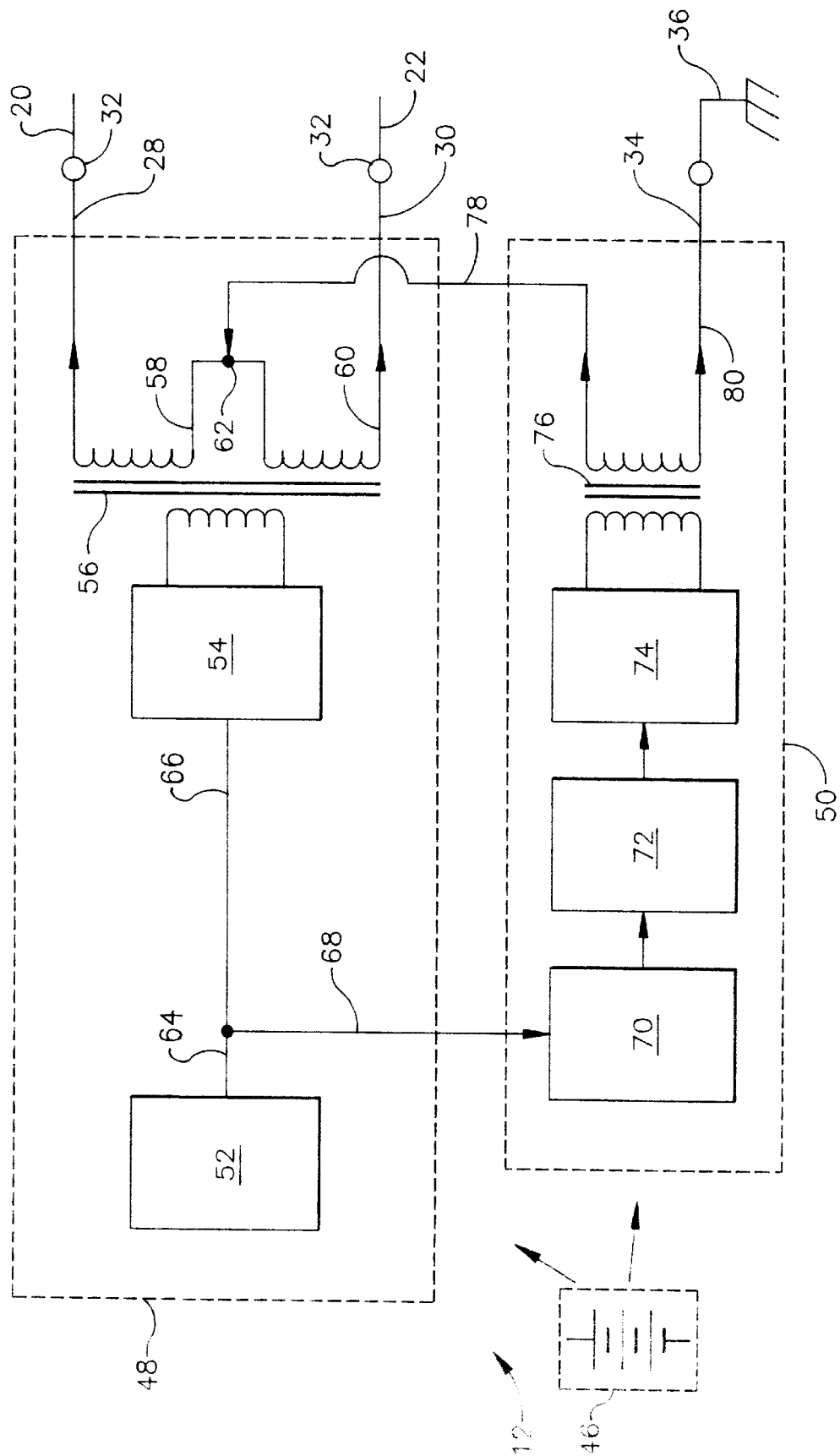
FIG. 2 is a block diagram of the transmitting unit shown in the device of FIG. 1.

Referring initially to FIG. 1, a fault locating device of the present invention is shown and generally designated 10. The fault locating device 10 has two basic components comprising a transmitting unit 12 and a receiving unit 14. The fault locating device 10 is operably positioned relative to a paired line 16, in which it is desired to locate a fault 18, such that the transmitting unit 12 engages a first conductor 20 and a second conductor 22 of the paired line 16 at a transmission point 24 on the paired line 16.

The fault locating device 10 of the present invention has general utility to paired lines employed in paired cables for a number of different applications, including power transmission and communications. As defined herein, a paired line is substantially any line having at least two continuous electrical conductors that, in the absence of a fault, are electrically insulated from one another. The two conductors can each be solid or braided wires, grounded or ungrounded and having parallel or spiral paths. Alternatively, one conductor can be a wire and the other conductor can be a conductive tubular shield enclosing the wire. The above-recited definition of a paired line encompasses coaxial cable, shielded cable, and cable having more than two conductors, wherein any two conductors of the cable may be deemed to define a paired line for purposes of the invention. For example, a paired line as defined herein includes a shielded cable having a shield and a conductor enclosed within the shield. The fault locating device 10 has particular utility to twisted paired lines employed in paired cable for telecommunications applications, including accessible paired cables, such as aerial paired cables, and inaccessible paired cables, such as buried paired cables.

A fault is defined herein as any unintended perturbation in the path of a conductor that undesirably draws current therefrom, such as a short, an open, a cross, a ground, a split, or a shield break. The present fault locating device 10 is applicable to the location of many types of faults as generally defined above.

The receiving unit 14 is operably positioned proximal to a reception point 26 on the paired line 16 that is between the transmission point 24 and the fault 18. As such, the receiving unit 14 preferably does not electrically contact the conductors 20, 22, but is sufficiently proximal to the conductors 20, 22 to induce induced locator and carrier signals in the receiving unit 14 as will be described hereafter. The transmission point 24 is preferably selected at a point on the paired line 16 where relatively convenient electrical access to the conductors 20, 22 is provided, such as a junction box or other splice location. Electrical communication is provided between the transmitting unit 12 and the conductors 20, 22 by test leads 28, 30 extending from the transmitting unit 12. The test leads 28, 30 have electrically conductive connectors 32, such as conventional alligator clips or the like, on their ends which are removably connected to the conductors 20, 22. A ground lead 34 is also provided, connecting the transmitting unit 12 in electrical communication with a ground 36.

As will be described in greater detail hereafter with respect to the method of operation, the position of the transmission point 24, and correspondingly the position of the transmitting unit 12, are substantially fixed relative to the paired line 16 during a given fault locating sequence. In contrast, the position of the reception point 26, and correspondingly the position of the receiving unit 14, are variable along the length of the paired line 16 throughout a given fault locating sequence. Accordingly, the receiving unit 14 has a fully mobile, unanchored, portable configuration. The receiving unit 14 is relatively compact and lightweight to render it manually transportable by a single operator. In the embodiment of FIG. 1, the receiving unit 14 is shown to comprise a unitary housing 38 and a probe 40 positioned outside the housing 38. A connective member 42 extends between the probe 40 and the housing 38. The housing 38 is preferably a hardened protective shell and the connective member 42 is typically an electrically conductive wire extending between the housing 38 and the probe 40, functioning in a manner described hereafter. The connective member 42 may further include a flexible or rigid pole supporting the electrically conductive wire. Although not shown, the probe 40 can alternatively be positioned within the housing 38, thereby eliminating the connective member 42 external to the housing 38.

The specific components of the transmitting unit 12 are described with further reference to the block diagram of FIG. 2. Substantially all of the circuitry of the transmitting unit 12 is enclosed in a housing 44 (shown in FIG. 1) comprising a hardened protective shell. The circuitry of the transmitting unit 12 includes a power source 46, a locator signal transmission circuit 48 and a carrier signal transmission circuit 50. As described above, the test leads 28, 30 extend from the transmitting unit 12 and removably connect with the conductors 20, 22 to provide electrical communication between the circuits 48, 50 and the paired line 16. The locator signal transmission circuit 48 is configured to generate and send locator signals along the conductors 20, 22 of the paired line 16 from the transmission point 24 toward the reception point 26. Included within the locator signal transmission circuit 48 is a locator signal output 52, which in the present embodiment is a locator signal oscillator. It is apparent to the skilled artisan that alternate locator signal outputs are possible within the scope of the present invention. The locator signal transmission circuit 48 further includes in series a locator signal driver 54, and a locator signal transformer 56. The outlet of the locator signal transformer 56 is segmented into a first outlet winding 58 and a second outlet winding 60 which are electrically coupled with the transmission lines 28, 30, respectively. A center tap 62 is provided between the two outlet windings 58, 60. The outlet line 64 of the locator signal output 52 is branched, with one branch line 66 extending to the locator signal driver 54 as described above and the other branch line 68 extending to the carrier signal transmission circuit 50.

The carrier signal transmission circuit 50 is configured to generate a carrier signal, provide the carrier signal with modulated synchronization, and transmit the modulated carrier signal along the conductors 20, 22 of the paired line 16 from the transmission point 24 toward the reception point 26. Included in series within the carrier signal transmission circuit 50 are a zero crossing detector 70, a carrier signal output 72, a carrier signal driver 74, and a carrier signal transformer 76. In the present embodiment, the carrier signal output 72 is a carrier signal oscillator. It is apparent to the skilled artisan that alternate carrier signal outputs are possible within the scope of the present invention. One outlet 78 of the carrier signal transformer 76 is electrically coupled with the center tap 62 of the locator signal transformer 56 and the other outlet 80 of the carrier signal transformer 76 extends through the ground leads 34 to ground 36 or to a cable shield (not shown), which functions as a ground.

The power source 46 is a DC power source included in the housing 44 of the transmitting unit 12. The power source 46 supplies power to the components of the transmitting unit 12 enabling the functions thereof. The power source 46 is preferably a relatively small, lightweight battery pack, such as one or more dry-cell or rechargeable batteries (e.g., D-cell batteries).

It is noted that the zero crossing detector 70 can be omitted from the transmitting unit 12 without disabling operation of the transmitting unit 12, as will be described hereafter.

The specific components of the receiving unit 14 are described with further reference to the block diagram of FIG. 3. The probe 40 (shown in FIG. 1) encloses a pickup coil 82 electrically coupled with the circuitry if the receiving unit 14. The pickup coil 82 has a balanced configuration which has specific utility for locating faults in an inaccessible paired line as will be described hereafter. It is understood that alternately configured pickup coils can be utilized, depending on the specific application of the fault locating device 10. The balanced pickup coil 82 is relatively large, typically having an elongated magnetic core or core of other geometry sufficient to meet the performance requirements of the receiving unit 14. The balanced pickup coil 82 includes a first coil segment 84 having a first coil outlet line 85 and a second coil segment 86 having a second coil outlet line 87. The first and second coil outlet lines 85, 87 in cooperation with first and second receiving circuitry inlet lines 88, 89, respectively, electrically couple the first and second coil segments 84, 86 with the circuitry of the receiving unit 14. Male/female connectors 90a, 90b such as conventional telephone jacks, are provided to releasably connect the first and second coil outlet lines 85, 87 and the first and second receiving circuitry inlet lines 88, 89, respectively. The connectors 90a, 90b enable the substitution of alternately configured coils for the balanced coil 82, such as described hereafter.

The spacing between the first and second coil segments 84, 86 which is defined as the distance between the midpoints of the segments, 84, 86 is about equal to one half the length of the lay of the paired line 16, wherein the paired line 16 is shown to be twisted and spiraled in the conventional manner of a telecommunications cable. The length of the lay for telecommunications cable is commonly about 36 inches and the current direction in each adjacent loop 91 of the lay differs by 180°. Thus, the first and second coil segments 84, 86 are phased due to the 18 inch spacing between the coil segments 84, 86 and the corresponding 36 inch length of the cable lay. The pickup coil 82 further includes a center tap 92 positioned on a coil common 93, which connects the first and second coil segments 84, 86. A third coil outlet line 94 extends from the center tap 92 through a connector 90c, similar to those described above, to a receiving unit common 95.

The circuitry of the receiving unit 14 includes a power source 94, an induced locator signal balancing/amplifying circuit 97, an induced locator signal processing circuit 98, an induced carrier signal processing circuit 100, and a capacitive signal processing circuit 102. The induced locator signal balancing/amplifying circuit 97 provides an electrical pathway for noise nulling in the receiving unit 14. The induced locator signal balancing/amplifying circuit 97 comprises a first balancing inlet pathway 104 and a second balancing inlet pathway 106 positioned in parallel. The first balancing inlet pathway 104 and the second balancing inlet pathway 106 are electrically coupled with the first coil segment 84 and the second coil segment 86 through the first and second receiving circuitry inlet lines 88, 89, connectors 90a, 90b, and first and second coil outlet lines 85, 87, respectively. Each balancing inlet pathway 104, 106 provides an inlet to a balancing amplifier 108. The first balancing inlet pathway 104 includes a pair of balancing resistors 110a, 110b and has a feedback line 112 electrically coupled with the outlet 114 of the balancing amplifier 108. The second balancing inlet pathway 106 also includes a pair of balancing resistors 116a, 116b and a branch line 118. The branch line 118 is electrically coupled with a balancing potentiometer 120, enabling balance adjustment of the pickup coil 82.

The induced locator signal balancing/amplifying circuit 97 selectively electrically communicates with the induced locator signal processing circuit 98 through a first switch 122 at the outlet 114 of the balancing amplifier 108 downstream of the branch line 112. The induced locator signal processing circuit 98 provides an electrical pathway capable of producing an audible or visual fault indicator for an operator in response to a balanced induced locator signal. When the first switch 122 is appropriately positioned, the balancing amplifier 108 of the induced locator signal balancing/amplifying circuit 97 is electrically coupled in series with a variable gain amplifier 124 and a band pass filter 126 of the induced locator signal processing circuit 98. The outlet 128 of the band pass filter 126 splits into a real component pathway 130 and a quadrature component pathway 132. The real component pathway 130 includes in series a real synchronous detector 134 and a real low pass filter 136, which lead to a second switch 138. The quadrature component pathway 132 similarly includes in series a quadrature synchronous detector 140 and a quadrature low pass filter 142, which lead to the second switch 138. The second switch 138 selectively electrically couples the real component pathway 130 or the quadrature component pathway 132 with an indicator output 144 of the induced locator signal processing circuit 98. The indicator output 144 comprises in parallel a display 146 and an audio speaker 148, having an associated output oscillator 150. The indicator output 144 enables the receiving unit 14 to communicate a fault indicator both visually and audibly to an operator of the device 10.

The induced locator signal processing circuit 98 is in electrical communication with the induced carrier signal processing circuit 100 by means of a phase shifter 152 electrically coupled with the outlet 154 of the induced carrier signal processing circuit 100. The outlet 156 of the phase shifter 152 splits into a real synchronization pathway 158 and a quadrature synchronization pathway 160. The real synchronization pathway 158 has a real synchronous oscillator 162 that is electrically coupled with the real synchronous detector 134. The quadrature synchronization pathway 160 similarly has a quadrature synchronous oscillator 164 that is electrically coupled with the quadrature synchronous detector 140. Although the real and quadrature synchronous oscillators 162, 164 are shown herein to be separate components, it is apparent to the skilled artisan that the oscillators 162, 164 can be replaced by a single oscillator or a microcontroller delivering real and quadrature synchronization signals in the same manner as described above.

The induced carrier signal processing circuit 100 provides an electrical pathway for producing and communicating a demodulated synchronization signal to the induced locator signal processing circuit 98. Included in series within the induced carrier signal processing circuit 100 are an induced carrier signal amplifier/receiver 166, an induced carrier signal limiter 168 and a synchronization signal output 170. In the present embodiment, the synchronization signal output 170 is a carrier signal demodulator. It is apparent to the skilled artisan that alternate synchronization signal outputs are possible within the scope of the present invention. As used herein, the term "limiter" is defined to encompass a conventional limiter or, in the alternative, an automatic gain control. The inlet 172 of the carrier signal amplifier/receiver 166 is electrically coupled with the first coil segment 84 via the receiving circuitry inlet line 88 and a receiving circuitry outlet line 174. The outlet 154 of the synchronization signal output 170 is electrically coupled with the inlet 178 of the phase shifter 152.

The capacitive signal processing circuit 102 selectively electrically communicates with the induced locator signal processing circuit 98 through the first switch 122. The capacitive signal processing circuit 102 in cooperation with the induced locator signal processing circuit 98 provides an electrical pathway capable of producing an audible or visual fault indicator for an operator in response to a capacitive signal. The capacitive signal processing circuit 102 includes in series a ground 179, a ground pickup 180 and a capacitive signal amplifier 182. If the housing 38 of the receiving unit 14 is electrically conductive, the ground pickup 180 is simply the housing 38. If the housing 38 is not electrically conductive, the ground pickup 180 can be provided by an electrical conductor, such as a metallic shield (not shown) contained within the housing 38. The ground pickup 180 is electrically coupled with the body of an operator (not shown) to provide the ground 179 and corresponding ground reference when the operator is standing on the earth. When the first switch 122 is appropriately positioned, the capacitive signal amplifier 182 of the capacitive signal processing circuit 102 is electrically coupled with the variable gain amplifier 124 and band pass filter 126 of the induced locator signal processing circuit 98.

The power source 96 is a DC power source included in the housing 38 of the receiving unit 14. The power source 96 supplies power to the components of the receiving unit 14 enabling the functions thereof. The power source 96 is preferably a relatively small, lightweight battery pack, such as described above with respect to the transmitting unit 12.

It is noted that the carrier signal amplifier/receiver 166 is shown and described herein as integrated into a single structure. In practice, this integrated structure can be separated into discrete structural components performing the same functions ascribed to the integrated structure in a manner apparent to the skilled artisan.

Referring to FIG. 4, an alternate nonbalanced pickup coil 186 is shown, which is substituted for the 82 balanced pickup coil. The nonbalanced pickup coil 186, which is a relatively small contact coil with a single coil segment and two outlets 190, 192, has specific utility for locating faults in an accessible paired line 16. The first outlet 190 is electrically coupled with the first balancing inlet pathway 104 through the connector 90a and the second outlet 192 is electrically coupled with the receiving unit common 95 through the connector 90c, while the second balancing inlet pathway 106 is open circuited. As a result, the balancing potentiometer 120 is rendered nonfunctional, while the balancing amplifier 108 functions as an unbalanced input amplifier.

Method of Operation

Operation of the fault locating device 10 is initially described with reference to FIGS. 1–3. The method of operation is initiated by identifying a paired line 16 that is believed to contain the fault 18. For purposes of illustrating a first embodiment of the method of the present invention, the fault 18 is characterized as a resistance fault and, more particularly, as a short fault. The paired line 16 is typically up to about 5000 meters in length, although practice of the present fault locating method applies to paired lines 16 of substantially greater length. An operator fixably positions the transmitting unit 12 at a transmission point 24 on the paired line 16. The test leads 28, 30 are removably connected to the first and second conductors 20, 22 at the transmission point 24 and the ground lead 34 is removably connected to ground 36 or the cable shield (not shown). The DC power source 46 energizes the locator signal output 52 and locator signal driver 54 of the locator signal transmission circuit 48, which generate an AC locator signal in the form of a variable voltage sine wave. The locator signal is delivered to the locator signal transformer 56 where the voltage of the locator signal is adjusted to a predetermined level. The first aid second outlet windings 58, 60 of the locator signal transformer 56 convert the locator signal to a first locator signal and a second locator signal, respectively, which have substantially identical voltage, but opposite polarity. The resulting first and second locator signals are introduced into the first and second conductors 20, 22, respectively, through the test leads 28, 30, respectively.

The variable voltage sine wave of the locator signal output 52 is also transmitted to the carrier signal transmission circuit 50 where the sine wave is converted to a square wave in the zero crossing detector 70. The square wave signal is then modulated in the carrier signal output 72, which is a voltage control oscillator, by frequency shift key modulation to produce a carrier signal having modulated synchronization. The resulting carrier signal is fed through the carrier signal driver 74 to the carrier signal transformer 76 where the voltage of the carrier signal is modified. The carrier signal is then introduced into each of the conductors 20, 22 via the outlet 78 of the carrier signal transformer 76, the center tap 92, the outlet windings 58, 60, and the test leads 28, 30 of the locator signal transmission circuit 48.

It is understood that the present invention can alternatively be practiced using a sine wave carrier signal rather than the square wave carrier signal described above. In accordance with this embodiment, the zero crossing detector 70 is omitted from the fault locating device 10 and the induced carrier signal processing circuit 100 is configured to process a sine wave, rather than a square wave, by varying the frequency of the carrier signal output 72 sinusoidally, in a manner readily apparent to the skilled artisan, in place of frequency shift key modulation.

The voltage and frequency of the locator and carrier signals are preferably limited to ranges that satisfy desirable performance criteria of the fault locating device 10. In particular, the voltage and frequency ranges of the locator signals are preferably selected at the upper end to avoid excessive carry-by of the locator signal on the paired line 16. Generally, a signal having both a very low voltage and a very low frequency avoids significant carry-by. Such a signal, however, may fail to satisfy other performance criteria of the device 10, lacking sufficient voltage to exceed the background noise or sufficient frequency to enable detection. If the frequency of the locator signals is raised to improve the detectability thereof, the locator signals may become overly susceptible to carry-by. Alternatively, if the voltage of the locator signals is raised to overcome the background noise, excessive battery power may become necessary.

Selection of the voltage and frequency of the locator signals may require a balancing of competing factors to achieve a fully-portable fault locating device 10 having detectable locator signals that exceed the background noise on the paired line 16 while avoiding the effects of excessive carry-by. Achievement of these performance criteria is facilitated by noise nulling means that reduce the noise induced in the pickup coil 82, and by synchronization circuitry that mitigates the impact of carry-by, as described hereafter. As such, the frequency of the locator signals is typically selected in the RF, audible, or sub-audible range. A preferred range is less than about 20,000 Hz, more preferably in a range between about 20,000 Hz and about 1 Hz, and most preferably in a range between about 1,500 and about 10 Hz. The voltage of the locator signals is typically selected in a range between about 1 volt and about 150 volts and on each conductor 20, 22, and preferably at a value of about 25 volts. The frequency of the induced locator signals is substantially identical to that of the transmitted locator signals, but the voltage is typically selected in a range between about 0.1 microvolt and 1000 microvolts and preferably at a value of about 10 microvolts, which is generally greater than ambient noise. The carrier signal has a frequency range greater than about 5 kHz, and preferably between about 5 kHz and about 100 kHz. The carrier signal typically has a voltage below about 150 volts within the prescribed frequency range and preferably has a voltage of about 25 volts.

The present method of locating the fault 18 proceeds by positioning the probe 40 of the receiving unit 14 proximal to a selected reception point 26 on the paired line 16, preferably between the transmission point 24 and the fault 18. The actual position of the reception point 26 is variable, rather than fixed, during operation of the fault locating device 10. The reception point 26 is preferably positioned near the transmission point 24 during initial operation of the device 10. The reception point 26 is then incrementally repositioned away from the transmission point 24 as operation of the device 10 proceeds. The relative distance between the probe 40 and the conductors 20, 22 at any given reception point 26 is termed the induction distance. The maximum allowable induction distance is a function of the power output of the transmitting unit 12, the size and configuration of the pickup coil, and the voltage of the locator and carrier signals in the conductors 20, 22. A typical maximum allowable induction distance is up to about 1 meter using the relatively large balanced pickup coil 82 for inaccessible buried paired cable and up to about 0.06 meters using the relatively small unbalanced pickup coil 186 for accessible paired cable.

The locator and carrier signals travel along the conductors 20, 22 to the reception point 26, where the locator and carrier signals induce induced locator and carrier signals in the balanced pickup coil 82 of the receiving unit 14. Since the spacing between the first and second coil segments 84, 86 is equal to one half the length of the lay of the paired line 16, the balanced pickup coil 82 sees two adjacent half lengths of the lay of the paired line 16 at any given reception point 26. Thus, a first induced locator signal is induced in the first coil segment 84 and a second induced locator signal of opposite polarity is induced in the second coil segment 86. The first and second coil segments 84, 86 are electrically coupled with the first and second balancing inlet pathways 104 and 106 to receive the induced locator signals of opposite polarity and sum the signals in the balancing amplifier 108. In contrast, background noise from sources such as nearby power lines (not shown) not having a 36 inch lay length induces induced noise signals of the same polarity in each coil segment 84, 86, which cancel in the balancing amplifier 108. Consequently, the balancing amplifier 108 outputs a balanced induced locator signal in response to the first and second induced locator signals, but is unresponsive to induced noise signals.

The specific configuration of the induced locator signal balancing/amplifying circuit 97 enhances the ability of the device 10 to reject interfering signals from the surroundings, while processing desired signals from the paired line 16. In particular, the induced locator signal balancing/amplifying circuit 97 is perfectly balanced when the first resistance ratio, defined as the resistance of the balancing resistor 110a divided by the resistance of the balancing resistor 110b, exactly equals the second resistance ratio, defined as the resistance of the balancing resistor 116a divided by the sum of the resistances of the balancing resistor 116b and the balancing potentiometer 120. The resistances of the balancing resistor 116b and the balancing potentiometer 120 are selected such that the induced locator signal balancing/amplifying circuit 97 is in perfect balance when the balancing potentiometer 120 is positioned at the center of its range. If an extraneous signal induces induced noise signals of equal polarity, but differing voltages, in the respective coil segments 84, 86, the balancing potentiometer can be offset to compensate for the voltage difference. As a result, the two induced noise signals can be summed to zero and canceled in the balancing amplifier 108 even when the voltages of the induced noise signals in the coil segments 84, 86 are not identical.

The balanced induced locator signal is transmitted from the induced locator signal balancing/amplifying circuit 97 to the induced locator signal processing circuit 98, while the induced carrier signal is transmitted from the pickup coil 82 to the induced carrier signal processing circuit 100. Specifically, the induced carrier signal is transmitted via the receiving circuitry outlet line 174 to the carrier signal amplifier/receiver 166, which amplifies and filters the induced carrier signal. The carrier signal limiter 168 subsequently limits the amplitude of the amplified signal. The synchronization signal output 170 demodulates the induced carrier signal, producing a synchronization signal that is transmitted from the synchronization signal output 170 to the phase shifter 152 of the induced locator signal processing circuit 98. If necessary, the phase shifter 152 corrects any phase irregularities in the synchronization signal caused by demodulation. The phase shifter 152 has a split outlet 156, such that the synchronization signal is transmitted in parallel to the real synchronous oscillator 162 and the quadrature synchronous oscillator 164. The real synchronous oscillator 162 produces a real synchronization signal that is in phase with the synchronization signal and transmits the real synchronization signal to the real synchronous detector 134. The quadrature synchronous oscillator 164 similarly produces a quadrature synchronization signal that is 90° out of phase with the synchronization signal and transmits the quadrature synchronization signal to the quadrature synchronous detector 140.

The balanced induced locator signal is transmitted to the induced locator signal processing circuit 98 through the first switch 122, which the operator has manually placed in an up position corresponding to a resistive short fault detection mode of operation. The voltage of the balanced induced locator signal is further amplified in the variable gain amplifier 124 and, if desired, adjusted for differences in the signal due to fault resistance losses. The band pass filter 126, which is tuned to the relatively low frequency of the balanced induced locator signal, rejects extraneous signals from the output of the variable gain amplifier 124 that have surrounding frequencies. In particular, the band pass filter 126 attenuates interference from 50/60 Hz signals that are magnetically induced onto the paired line 16 by adjacent power lines.

The balanced induced locator signal, which is output from the band pass filter 126, is split and fed in parallel to the real component pathway 130 and the quadrature component pathway 132 of the induced locator signal processing circuit 98. The balanced induced locator signal may be characterized as comprising a real component and a quadrature component, one or both of which may be present in the balanced induced locator signal at any given time during operation of the device 10. The real component is resistive current that is in phase with the voltage of the locator signal generated in the transmitting unit 12. The quadrature component is capacitive current that leads the voltage of the locator signal generated in the transmitting unit 12 by 90°. Accordingly, the real component pathway 130 and quadrature component pathway 132 detect and segregate the respective components of the balanced induced locator signal, based on phase synchronization. The real synchronous detector 134 utilizes the real synchronization signal to detect only the presence of the real component, which corresponds to the current of the locator signal flowing through the fault resistance, and to reject any carry-by occurring due to current flow into pair capacitance or conductor-to-ground capacitance. The quadrature synchronous detector 140 conversely utilizes the quadrature synchronization signal to detect only the presence of the quadrature component, which corresponds to current flow into capacitance, and to reject the current flowing through the fault resistance or leakage on the conductor. The real low pass filter 136 filters the rectified DC signal from the real synchronous detector 134, allowing a narrowing of the circuit bandwidth to more effectively filter out 50/60 Hz signals and other extraneous signals having undesired frequencies. The quadrature low pass filter 142 similarly filters the rectified DC signal from the quadrature synchronous detector 140.

Since the present fault 18 is a resistance fault, the operator has manually placed the second switch 138 in an up position, enabling the resistive short fault detection mode of operation. The second switch 138 electrically couples the real low pass filter 136 with the indicator output 144 of the induced locator signal processing circuit 98. The real component is transmitted to the indicator output 144 which operates in correspondence with the presence and magnitude of the real component to communicate a fault indicator to the operator. In particular, the output oscillator 150, which is an audio voltage control oscillator, and the audio speaker 148 generate an audible correlation of the real component in the form of a continuous audible tone having an intensity or frequency directly related to the presence and voltage magnitude of the real component. As the magnitude of the real component increases, the intensity or frequency of the tone generated by the speaker increases. Correspondingly, as the magnitude of the real component decreases, the intensity or frequency of the tone generated by the speaker decreases.

When the receiving unit 14 approaches the resistive short fault 18 from the transmission point 24, the receiving unit 14 detects voltage due to current flow in the fault resistance. The magnitude of this voltage may rise and fall and reverse in polarity as the pickup coil 82 is moved along the paired cable containing the paired line 16 due to the twist of the conductors 20, 22 and the spiraling of the paired line 16 within the paired cable, but will remain continuous before the fault 18 is reached. Polarity changes can be communicated to the operator by a change in a characteristic of the audible tone generated by the output oscillator 150 in correspondence with polarity changes. In any case, when the receiving unit 14 passes the fault 18, the receiving unit 14 no longer detects any voltage. Thus, the fault 18 in the paired line 16 is located by moving the receiving unit 14 along the paired line 16 away from the transmission point 24 in the direction of the fault 18 to establish incrementally new reception points 26. The fault 18 is precisely located at the point on the paired line 16 where the intensity or frequency of the tone from the speaker 148 is strong followed by an abrupt drop in the intensity or frequency of the tone as the receiving unit 14 continues along the paired line 16. The display 146 provides a quantitative visual verification of the information communicated to the operator by the speaker 148. The display 146 is a visual correlation of the magnitude of the real component in the form of either an analog or a digital readout of the values of the magnitude as the receiving unit 14 is moved along the paired line 16.

Although voltage is selected herein as the characteristic of the induced locator signal which is quantified by the indicator output 144 to enable fault location, it is apparent to the skilled artisan that an alternate characteristic of the induced locator signal can be selected for quantification, such as phase shift, to enable fault location within the scope of the present invention.

Figure 5A:
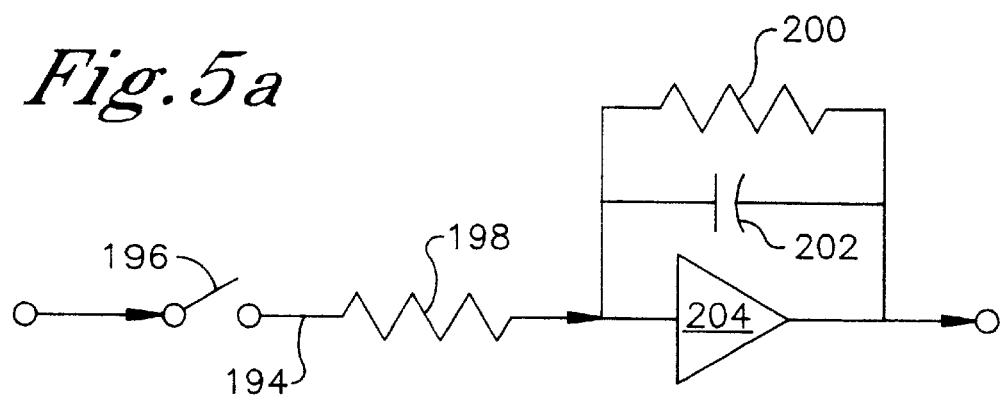
FIGS. 5a, 5b, 5c depict conceptualized operation of a synchronous detector employed in the receiving unit of FIG. 3.
Figure 5B:
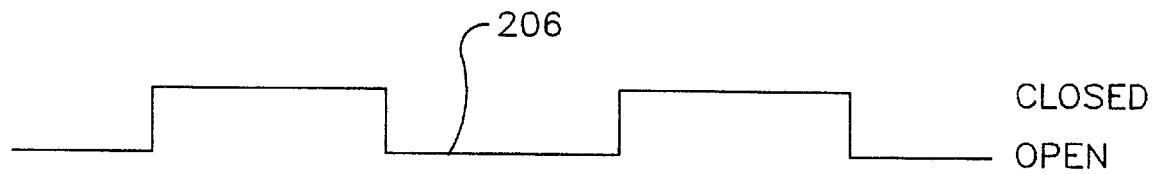
Figure 5C:
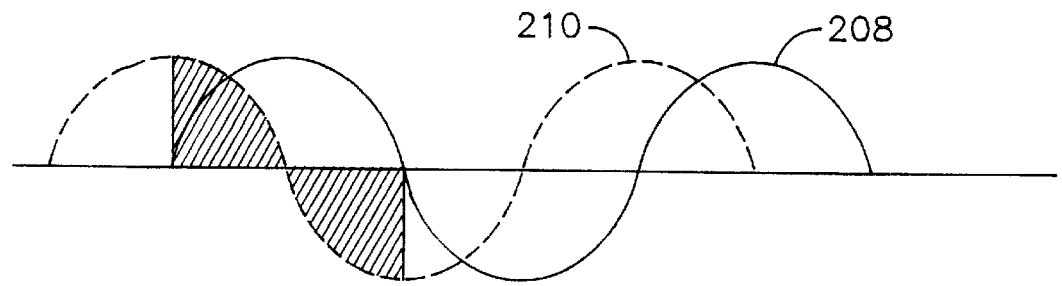

The principle by which the real synchronous detector 134, and correspondingly the quadrature synchronous detector 140, operate is described with reference to FIGS. 5*a*, 5*b* and 5*c*. Operation of the real synchronous detector 134 in association with the fault locating device 10 of FIG. 1 is the functional equivalent of a circuit 194 shown in FIG. 5*a*. The circuit 194 has a switch 196 that is opened and closed in synchronism with the induced locator signal in the receiving unit 14. The circuit 194 further includes a series resistor 198 and, in parallel, a resistor 200, a capacitor 202 and an amplifier 204 such that the output voltage of the circuit 194 is the average input voltage of the circuit 194 when the switch 196 is closed. The switch 196 is opened and closed as shown in FIG. 5*b* by the switch waveform 206. FIG. 5*c* shows the input voltage waveform of the circuit 194 as the sum of two distinct waveforms, a resistance current waveform 208 and a capacitance current waveform 210.

By opening and closing the switch 196 in synchronism with the input voltage waveform, in accordance with the relationship shown in FIGS. 5*b* and 5*c*, the capacitance current waveform 210 of the carry-by leads the resistance current waveform 208 by 90°, thereby averaging to zero as indicated by the shaded area under the capacitance current waveform 210 of FIG. 5*c*. In contrast, the entire fault resistance current waveform 208 is in phase with the induced locator signal and the switch waveform 206, thereby enabling detection of the resistance fault.

Synchronous operation of the receiving unit 14 and transmitting unit 12 in conjunction with the use of locator signals having a relatively low frequency enables the effective location of faults having resistances above 50 kohms without a significant impact from carry-by, even in relatively long paired lines 16 having lengths of 5000 meters or more. Low frequency operation tends to decrease carry-by because lowering the frequency of the locator signal increases the capacitive reactance of the paired line 16, reducing the magnitude of locator signal current flow past the fault 18. The low frequency locator signal has the added advantage of exhibiting substantially less attenuation over length of the paired line 16 than would a higher frequency locator signal. Synchronous detection further enables the operator to observe changes in polarity due to twisting of the conductors 20, 22. This permits the operator to differentiate between carry-by and the locator signal in the presence of unbalanced conductor faults and ground faults both of which are more susceptible to carry-by than balanced conductor faults.

In another embodiment of the present method, the fault 18 is characterized as an open fault, which is generally defined herein to include a splice containing a bridge tap, i.e., a conductor bridged onto the main conductor. The operator manually repositions the second switch 138 in a down position, enabling the open fault detection mode of operation. The second switch 138 electrically couples the quadrature low pass filter 142 with the indicator output 144 of the induced locator signal processing circuit 98. The quadrature low pass filter 142 filters the rectified DC signal from the quadrature synchronous detector 140 in substantially the same manner as the real low pass filter 136. The quadrature component is transmitted to the indicator output 144. The indicator output 144 operates in correspondence with the presence and magnitude of the quadrature component in substantially the same manner as described above with respect to the real component to locate the position of the open fault on the paired line. Location of the bridged tap is alternately enabled because the bridged conductor draws capacitive currents, which are monitored when the device 10 is configured to locate open faults. When the receiving unit 14 passes a splice in the paired line 16 containing a bridged tap, there is an abrupt drop in the magnitude of capacitive current flowing through the paired line 16, producing a corresponding abrupt drop in the audible or visual fault indicator.

In an alternate method of operating the fault locating device 10, a cable shield break is located in a cable having at least one conductor surrounded by a shield. Referring to FIG. 6, a cable 212 is shown, to which the present method of locating a shield break is applicable. The cable 212 has a shield 214 and at least one continuous concentric wire enclosed thereby as a conductor 216. It is understood that additional continuous wires may also be present within the shield 214 to provide the cable 212 with multiple conductors. Referring additionally to FIG. 3, the method is performed by installing the unbalanced pickup coil 186 of FIG. 4 in the receiving unit 14 and manually placing the first switch 122 in the down position to connect the capacitive signal processing circuit 102 with the induced locator signal processing circuit 98. The conductor 216 is grounded to the cable shield 214 at both ends (not shown) of the cable 212 and a locator signal is sent by the transmitting unit 12 along the conductor 216 of the cable 212. When the shield 214 is broken, the locator signal flowing in the conductor 216 generates a longitudinal voltage on the cable shield 214 which is normally shorted to earth at each shield ground connection. However, in the case of a shield break, the voltage builds up on the shield 214 at the point of the break.

The unbalanced pickup coil 186, which is a capacitive pickup functioning as a capacitor, impresses a capacitive signal onto the receiving unit common 95 through the third coil outlet line 94 in response to the voltage on the cable shield 214 as the receiving unit 14 is moved along the length of the cable 212. It is noted that the receiving unit common 95 is floating ungrounded within the insulated receiving unit housing 44. The ground pickup 180 is grounded, for example, by capacitively coupling with the operator, who in turn is coupled with the earth through his feet. Accordingly, the capacitive signal that appears in the pickup coil 186 is received by the capacitive amplifier 182 via the receiving unit common 95. The capacitive amplifier 182 amplifies the difference between the capacitive signal and the ground reference received via the ground pickup 180. The resulting differential capacitive signal is sent to the induced locator signal processing circuit 98 for evaluation. Since the capacitive signal reverses polarity across the shield break (not shown) and is al: a maximum level when the receiving unit 14 is adjacent to the shield break, the speaker 148 and/or display 146 communicate the level of the differential capacitive signal to the operator along the length of the cable 212, thereby enabling precise location of the shield break within the cable 212.

Although the unbalanced pickup coil 186 is described as the capacitive pickup herein, the present invention is not so limited. It is apparent to the skilled artisan that substantially any component functioning as a capacitive plate can serve as the capacitive pickup within the scope of the present invention.

While the forgoing preferred embodiments of the invention have been described and shown, it is understood that alternatives and modifications, such as those suggested and others, may be made thereto and fall within the scope of the invention.

I claim:

1. A device for locating a fault in a paired line comprising:
    means connectable to a first point on a paired line for generating and introducing a locator signal into said paired line;
    means connectable to said first point for generating and introducing a carrier signal into said paired line, wherein said carrier signal includes synchronization of said locator signal generating means;
    means positionable at a second point on said paired line for creating an induced locator signal in response to said locator signal;
    means positionable at said second point on said paired line for creating an induced carrier signal including said synchronization in response to said carrier signal;
    means responsive to said induced locator signal and said induced carrier signal for detecting a component of said induced locator signal indicative of a fault; and
    means for communicating an indicator of said component to an operator, wherein said communicated indicator enables location of said fault in said paired line.

2. The device of claim 1 wherein said locator signal generating means is a first locator signal generating means connectable to a first conductor at said first point for generating and introducing said first locator signal into said first conductor, said device further comprising a second means connectable to a second conductor at said first point on said paired line for generating and introducing a second locator signal into said second conductor.

3. The device of claim 1 wherein said induced locator signal creating means is a first induced locator signal creating means positionable at said second point on said paired line for creating said first induced locator signal in response to said locator signal, said device further comprising a second means positionable at said second point on said paired line for creating a second induced locator signal in response to said locator signal.

4. The device of claim 3 further comprising means for creating a balanced induced locator signal from said first and second induced locator signals.

5. The device of claim 1 wherein said component is a first component corresponding to a real phase of said locator signal generating means and said induced locator signal has a second component corresponding to a quadrature phase of said locator signal generating means, further wherein said detection means is a first detection means for detecting said first component, said device further comprising a second detection means for detecting said second component.

6. The device of claim 5 wherein said synchronization includes real synchronization and quadrature synchronization, said device further comprising means for generating and transmitting a real synchronization signal corresponding to said real synchronization to said first detection means and means for generating and transmitting a quadrature synchronization signal corresponding to said quadrature synchronization to said second detection means.

7. The device of claim 5 further comprising means for selecting said first component to the exclusion of said second component or selecting said second component to the exclusion of said first component aid transmitting said selected component to said indicator communicating means.

8. A device for locating a fault in a paired line comprising:
   a locator signal output connectable to a first point on a paired line to generate a locator signal for transmission through said paired line to a second point on said paired line;
   a carrier signal output connectable to said first point on said paired line to generate a carrier signal including synchronization for transmission through said paired line to a second point on said paired line;
   a pickup coil movably positionable at said second point on said paired line to create an induced locator signal having at least one component indicative of a fault and to create an induced carrier signal including said synchronization;
   a detector in electrical communication with said pickup coil to detect said at least one component; and
   a synchronization signal output in electrical communication with said detector to create a synchronization signal corresponding to said synchronization included in said induced carrier signal.

9. The device of claim 8 wherein said detector is a first detector to detect a first component of said locator signal indicative of said fault to the exclusion of a second component of said locator signal indicative of said fault, said device further comprising a second detector to detect said second component to the exclusion of said first component.

10. The device of claim 9 further comprising a switch in selective electrical communication with said first detector or said second detector, and an audio speaker or a display responsive to said first component or said second component.

11. The device of claim 8 wherein said induced locator signal is a first induced locator signal, and further wherein said pickup coil has a first coil segment to create said first induced locator signal and a second coil segment to create a second induced locator signal in response to said locator signal generated by said locator signal output.

12. The device of claim 8 wherein said locator signal is a first locator signal, said device further comprising a locator signal transformer having a first outlet winding to deliver said first locator signal to said paired line and a second outlet winding to deliver a second locator signal of opposite polarity to said paired line.

13. The device of claim 11 further comprising an induced locator signal balancing circuit to produce a balanced induced locator signal in response to said first and second induced locator signals.

14. The device of claim 13 wherein said locator signal balancing circuit includes a balancing amplifier and a balancing potentiometer positioned in parallel.

15. The device of claim 9, further comprising a real synchronous oscillator in electrical communication with said first detector to transmit a real synchronization signal to said first detector and a quadrature synchronous oscillator in parallel with said real synchronous oscillator and in electrical communication with said second detector to transmit a quadrature synchronization signal to said second detector.

16. The device of claim 8 wherein said locator signal output is a locator signal oscillator.

17. The device of claim 8 wherein said carrier signal output is a carrier signal oscillator.

18. The device of claim 8 wherein said synchronization signal output is a demodulator.

19. A method for locating a fault in a paired line comprising:
   a) generating a locator signal and a carrier signal including synchronization at a first point of a paired line, wherein said paired line has a fault;
   b) electrically introducing said locator signal and said carrier signal into said paired line at said first point;
   c) creating an induced locator signal and an induced carrier signal including synchronization at a second point on said paired line in response to said locator signal and said carrier signal;
   d) detecting a component of said locator signal indicative of said fault; and
   e) communicating an indicator of said component to an operator, wherein said communicated indicator enables location of said fault in said paired line.

20. The method of claim 19 wherein said locator signal is a first locator signal introduced into a first conductor at said first point and said method further comprises generating and electrically introducing a second locator signal into a second conductor at said first point on said paired line.

21. The method of claim 19 wherein said induced locator signal is a first induced locator signal created in response to said locator signal and said method further comprises creating a second induced locator signal in response to second locator signal.

22. The method of claim 21 further comprising balancing said first and second induced locator signals to produce a balanced induced locator signal.

23. The method of claim 19 wherein said component is a first component corresponding to a real phase of said locator signal and said locator signal has a second component indicative of said fault corresponding to a quadrature phase of said locator signal, said method further comprising detecting said second component.

24. The method of claim 23 further comprising segregating said first component from said second component.

25. The method of claim 19 wherein said synchronization includes real synchronization and quadrature synchronization, said method further comprising creating a real synchronization signal from said real synchronization to detect said first component and creating a quadrature synchronization signal from said quadrature synchronization to detect said second component.

26. The method of claim 23 further comprising selecting said first component to the exclusion of said second component or selecting said second component to the exclusion of said first component, wherein said indicator corresponds to said selected component.

* * * * *